(12) United States Patent
Giboney (10) Patent No.: US 9,651,848 B2
(45) Date of Patent: May 16, 2017

(54) OPTICAL MODULATOR DIRECTIONAL MEASUREMENT SYSTEM

(71) Applicant: Kirk S. Giboney, Santa Rosa, CA (US)

(72) Inventor: Kirk S. Giboney, Santa Rosa, CA (US)

(*) Notice: Subject to any disclaimer, the term of this patent is extended or adjusted under 35 U.S.C. 154(b) by 0 days.

(21) Appl. No.: 14/955,679

(22) Filed: Dec. 1, 2015

(65) Prior Publication Data
US 2016/0091774 A1 Mar. 31, 2016

Related U.S. Application Data

(63) Continuation of application No. 13/831,227, filed on Mar. 14, 2013, now Pat. No. 9,239,348.

(51) Int. Cl.
| G02B 6/26 | (2006.01) |
| G02F 1/29 | (2006.01) |
| G01R 27/28 | (2006.01) |
| G02F 1/225 | (2006.01) |
| G02F 2/00 | (2006.01) |

(52) U.S. Cl.
CPC ........... *G02F 1/29* (2013.01); *G01R 27/28* (2013.01); *G02F 1/2255* (2013.01); *G02F 2/002* (2013.01); *G02F 2203/13* (2013.01)

(58) Field of Classification Search
USPC ..................................................... 385/2, 8
See application file for complete search history.

(56) References Cited

U.S. PATENT DOCUMENTS

| 7,280,267 B2 | 10/2007 | Van Tuyl |
| 8,421,493 B2 | 4/2013 | Mangeney |
| 8,952,678 B2 | 2/2015 | Giboney |
| 2002/0031305 A1* | 3/2002 | Ticknor ............... G02B 6/3502 385/48 |
| 2014/0270619 A1 | 9/2014 | Giboney |

OTHER PUBLICATIONS

Meignien, et al., "Two-port vectorial terahertz electro-optic sampling system," Appl. Phys. Lett., vol. 92, No. 131103, 2008.
Valdmanis, "Electro-Optic Measurement Techniques for Picosecond Materials, Devices, and Integrated Circuits," in Measurement of High-Speed Signals in Solid State Devices, R. B. Marcus, Ed. San Diego: Academic Press, 1990, pp. 135-219.
Weingarten, et al., "Picosecond Optical Sampling of GaAs Integrated Circuits," IEEE J. Quantum Electron., vol. 24, No. 2, pp. 198-220, Feb. 1988. See section IV. C. and section V.
Popovic, et al., "THz Metrology and Instrumentation," IEEE Trans. Terahertz Science Technol., vol. 1, No. 1, pp. 133-144, Sep. 2011. See sections IV. and VI.
Yariv, Optical Electronics, 4th ed. San Francisco: Saunders College, 1991, Ch. 9 and Append. C. See sections 9.6, 9.8, 9.9, and Appendix C.
Giboney, et al., Inventorship Statement, Mar. 26, 2013.

* cited by examiner

*Primary Examiner* — Eric Wong (57) ABSTRACT

In an optical modulator directional measurement system embodiment, one or more modulation waves may be measured and directionally discriminated by measuring the modulations of one or more lightwaves. The optical modulator transmission function magnitude for a most phase-matched modulation may be substantially greater than that for other modulations. At sufficiently high modulation frequency, the most phase-matched modulation magnitude may be substantially greater than the other modulation magnitudes. Accordingly, a modulation wave may be distinctly measured by measuring the modulation of the most phase-matched lightwave.

21 Claims, 4 Drawing Sheets

OPTICAL MODULATOR DIRECTIONAL MEASUREMENT SYSTEM

CROSS-REFERENCES TO RELATED APPLICATIONS

This is a continuation of U.S. patent application Ser. No. 13/831,227, filed on 2013 Mar. 14, now U.S. Pat. No. 9,239,348.

DESCRIPTION

Background Art

The background art discussed in this section includes information disclosed under 37 CFR §1.97 and §1.98.

The performance of current directional measurement instruments, such as network analyzers, is inadequate for many possible applications that extend significantly above one hundred gigahertz. Existing and proposed directional measurement systems that form the cores of directional measurement instruments suffer from limited directivity or bandwidth at frequencies above one hundred gigahertz.

A lightwave is modulated by a modulation wave in an optical modulator. The modulation wave is often in the form of a radio wave, microwave, or millimeter wave and guided by a modulation waveguide of the optical modulator. A travelling-wave optical modulator may be employed in an optical system having modulation in the microwave or millimeter-wave frequency range. In a travelling-wave optical modulator, the modulation wave is substantially coherent with the lightwave modulation over the length of the modulator, and operation is said to be phase-matched.

SUMMARY OF INVENTION

Technical Problem

A directional measurement system that provides a combination of good directivity and large bandwidth at frequencies above one hundred gigahertz would enable a range of useful applications. What is needed is a directional measurement system, embodiments of which may be configured to operate within a frequency range from 1 GHz to 8 THz and provide for a combination of:
  a) directivity less than −10 dB; and
  b) operational bandwidth frequency ratio of greater than 10:1.

Solution to Problem

In an optical modulator directional measurement system (OMDMS) embodiment, one or more modulation waves may be measured and directionally discriminated by measuring the modulations of one or more lightwaves. The optical modulator transmission function magnitude for a most phase-matched modulation may be substantially greater than that for other modulations. At sufficiently high modulation frequency, the most phase-matched modulation magnitude may be substantially greater than the other modulation magnitudes. Accordingly, a modulation wave may be distinctly measured by measuring the modulation of the most phase-matched lightwave.

A signal may be measured by applying it as a modulation wave to an optical modulator and measuring the resulting lightwave modulation. An optical modulator transmission function generally depends upon the velocity of the modulation wave, the velocity of the lightwave modulation, the path length over which the lightwave is modulated, and the modulation frequency, among other parameters. At the phase-matched condition, the optical modulator transmission function is substantially independent of the path length and modulation frequency limitations due to phase mismatch.

When the angle between the modulation-wave velocity and the lightwave modulation velocity is other than those angles producing the phase-matched condition, the optical modulator transmission function magnitude is less than that for the phase-matched condition. The optical modulator transmission function magnitude for a lightwave modulation phase-matched with a modulation wave may be substantially greater than the transmission function magnitude for a phase-mismatched lightwave modulation.

In an OMDMS embodiment, a first modulation wave may modulate a first lightwave more than a second lightwave propagating in a direction different from that of the first lightwave, the first lightwave modulation being substantially more phase-matched with the first modulation wave than is the second lightwave. At sufficiently high frequency, the optical modulator transmission function magnitude for the more phase-matched modulation may be substantially greater than that for the other modulation, and the first modulation wave may be distinctly measured by measuring the modulation of the first lightwave.

Directional measurements of other modulation waves propagating in different directions may be simultaneously executed in a similar manner in the same OMDMS embodiment. For example, a second modulation wave, propagating in a direction different from that of the first modulation wave, may be distinctly measured by a second lightwave modulation that is substantially more phase-matched with the second modulation wave than is the first lightwave modulation.

At sufficiently high frequency, modulations of the first and second lightwaves may be dominated by the first and second modulation waves, respectively. In this manner, the first and second modulation waves may be independently measured and directionally discriminated by measuring the modulations of the first and second lightwaves in the OMDMS embodiment.

In another OMDMS embodiment, the angle of a lightwave path may be varied to measure the signal and direction of one or more modulation waves. In yet another OMDMS embodiment, multiple lightwaves propagated in different directions may be used to measure the signals and directions of one or more modulation waves.

Advantageous Effects of Invention

One or more embodiments of an OMDMS may be configured to operate within the frequency range from 1 GHz to about 8 THz and afford two or more of the following advantageous attributes:
  a) Forward and backward waves may be measured with directivity less than −10 dB, and the directivity may generally decrease with increasing frequency.
  b) Operational bandwidth frequency ratio may be greater than 10:1.
  c) Modulation waves may be mixed with previously modulated lightwaves, facilitating such measurement techniques as heterodyne, homodyne, or sampling without requiring a high-bandwidth optical receiver and separate mixer.

d) Modulation waves other than forward and backward waves may be measured.
e) Measurements may be modulation-wave-mode-selective.

The foregoing has summarized solution to problem and advantageous effects. The following descriptions, drawings, and claims will further illuminate the solution and one or more advantageous effects of one or more aspects.

BRIEF DESCRIPTION OF DRAWINGS

The present teachings may be more readily understood from the following detailed description with reference to the accompanying drawings. The drawing figures may not be drawn to scale, and small features of non-essential functional consequence, such as some optical refractions, for example, may not be depicted. Wherever practical, like reference numerals refer to like features.

DESCRIPTION OF EMBODIMENTS

Embodiments are described with reference to the drawings in the following examples, by which the invention may be better understood. The terms left, right, up, down, upper, lower, upward, downward, vertical, horizontal, above, below, width, height, forward, backward and similar terms in reference to the embodiment drawings are intended to convey to the reader locations, directions, or dimensions on the drawings or distinguish instances and do not imply any preferred orientation of the structures represented. Ordinal numbers and cardinal number labels as used in this specification and the attendant claims, only distinguish between instances of an element or limitation unless explicitly stated otherwise.

Embodiments of the invention are described in detail in the following examples. The detailed explanations are sufficient to enable one of ordinary skill in the art to design, configure, fabricate, and use the invention in its various forms, both explicit and implicit.

DEFINITIONS

Terms used in this specification and the attendant claims are defined specifically as follows.

As used in this specification and the attendant claims, "electro-optic modulation" is a type of optical modulation based on the linear electro-optic or Pockels effect.

As used in this specification and the attendant claims, an "electro-optic material" is defined as a material that exhibits the linear electro-optic effect or equivalently, has non-zero linear electro-optic or Pockels coefficients.

As used in this specification and the attendant claims, a "gap waveguide" is defined as a conductive tubular electromagnetic waveguide having an interior gap that principally condenses a dominant mode, called a "gap mode," near the interior gap. Gap waveguides include waveguide types such as metallic ridge waveguide known in the art and gap-mode waveguide. Examples of gap-mode waveguide may be found in U.S. Patent Application, Publication Number 2012/0243823.

As used in this specification and the attendant claims, a "conductive tubular electromagnetic waveguide" is defined as having a wall or set of walls, an interior region within the wall or walls, and an exterior, the wall or walls being of sufficient conductivity and thickness for the purpose of guiding electromagnetic wave modes primarily within the interior region by the wall or walls. Conductive tubular electromagnetic waveguides include waveguide types such as ridge waveguide, gap-mode waveguide, and common rectangular and circular hollow metallic waveguides.

As used in this specification and the attendant claims, an "interior gap" is defined as a gap between proximate interior surface portions of at least one conductor wall along the propagation direction and in the interior region of a conductive tubular electromagnetic waveguide.

As used in this specification and the attendant claims, modes propagating in different directions are considered distinct modes. For example, a "first mode" may be a forward-propagating dominant mode, while a "second mode" may be a backward-propagating dominant mode, even though both are nominally dominant modes.

Figure 1A:
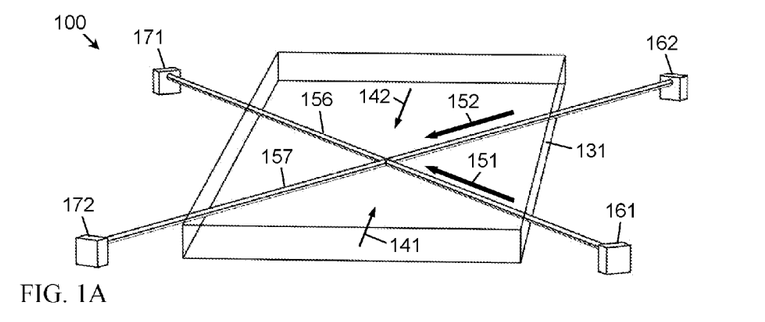
FIG. 1A is a perspective view of an optical modulator directional measurement system embodiment according to EXAMPLE 1.
Figure 1B:
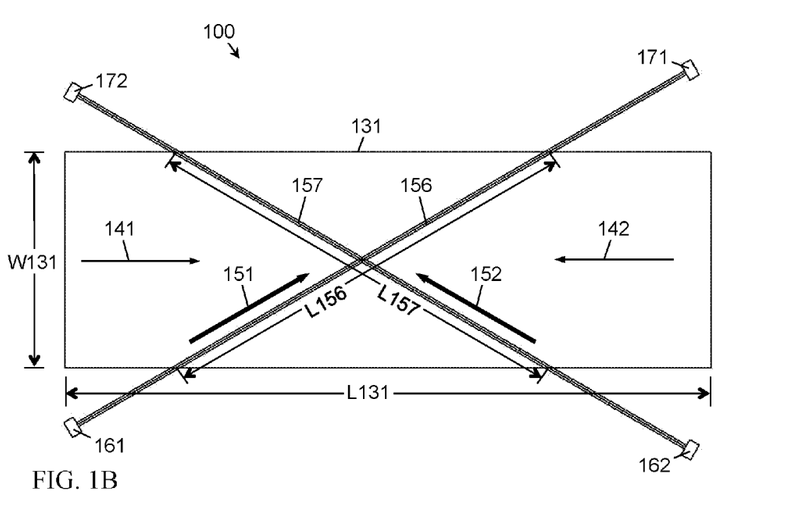
FIG. 1B is a plan view of the optical modulator directional measurement system embodiment according to EXAMPLE 1.
Figure 1C:
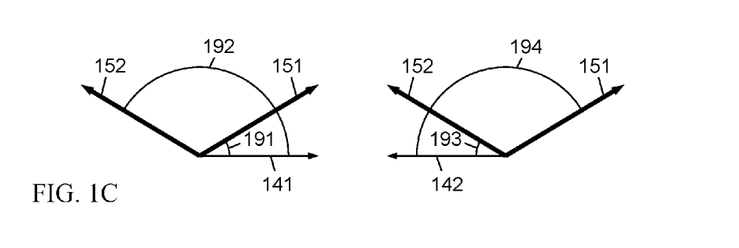
FIG. 1C is a diagram of the modulation wave velocity vectors, lightwave modulation velocity vectors, and relative propagation angles of the optical modulator directional measurement system embodiment according to EXAMPLE 1.
Figure 2:
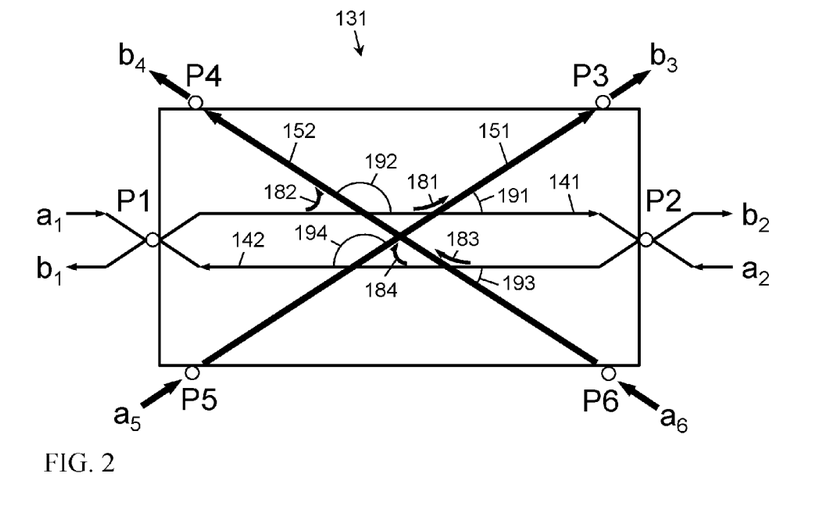
FIG. 2 presents a network model of an optical modulator of the optical modulator directional measurement system embodiment according to EXAMPLE 1.

EXAMPLE 1 (FIGS. 1A-2)

An optical modulator directional measurement system (OMDMS) embodiment 100, illustrated in perspective view in FIG. 1A and in an overhead or plan view in FIG. 1B, enables directional measurements of forward and backward modulation waves. The forward and backward modulation waves, represented by forward and backward modulation wave velocity vectors, 141 and 142, propagate in an optical modulator 131 having a width W131 and length L131. The forward and backward modulation waves may derive from any source that meets the criteria for modulation waves, including: known or unknown sources in free space; elements such as probes, antennas, mirrors, or lenses; waveguides unconnected or connected to the optical modulator 131; or materials or devices emitting waves.

Optical transmitters, 161 and 162, transmit forward and backward lightwaves, represented by forward and backward lightwave modulation velocity vectors, 151 and 152. The forward and backward lightwaves follow optical paths, 156 and 157, of optical path lengths, L156 and L157, in the optical modulator 131. The optical receivers, 171 and 172, receive the forward and backward lightwaves and demodulate them.

FIG. 1C shows the modulation wave velocity vectors, 141 and 142, the lightwave modulation velocity vectors, 151 and 152, and relative propagation angles, $\theta_1$, $\theta_2$, $\theta_3$, and $\theta_4$, 191, 192, 193, and 194. The forward modulation wave velocity vector 141 and the backward modulation wave velocity vector 142 are oppositely directed; the angle between them is about π radians. The forward lightwave modulation velocity vector 151 is at the angle $\theta_1$ 191 relative to the forward modulation wave velocity vector 141. The backward lightwave modulation velocity vector 152 is at the angle $\theta_2$ 192 relative to the forward modulation wave velocity vector 141. The backward lightwave modulation velocity vector 152 is at the angle $\theta_3$ 193 relative to the backward modulation wave velocity vector 142. The forward lightwave modulation velocity vector 151 is at the angle $\theta_4$ 194 relative to the backward modulation wave velocity vector 142.

The optical modulator 131 employs a medium through which the modulation waves, represented by modulation wave velocity vectors, 141 and 142, modulate the lightwaves, represented by lightwave modulation velocity vectors, 151 and 152. In general, the modulation may be of any format that encodes the information of the modulation waves onto the lightwaves, including amplitude, phase, frequency, polarization, or direction modulation. The modulation mechanism may be of any type that is compatible with the modulation waves for which directional measurements may be desired, such modulation mechanisms including electro-optic, magneto-optic, acousto-optic, plasma-optic, or gain- or loss-modulation. The modulation waves would have the requisite properties corresponding to the employed modulation mechanism, electric fields corresponding to electro-optic, for example.

The optical modulator 131 of the present example employs a material that exhibits the linear electro-optic or Pockels effect. Non-centrosymmetric crystals exhibit the linear electro-optic or Pockels effect. Materials in which the linear electro-optic effect is commonly exploited include lithium niobate, lithium tantalate, potassium iodate, and compound semiconductors such as GaAs, InP, and related compounds. Many materials exhibiting the linear electro-optic effect have been extensively characterized and several applications, including some embodiments of electro-optic modulators and travelling-wave electro-optic modulators, are well-known in the art.

The optical modulator 131 of the present example embodiment is composed of a (111)-oriented GaAs wafer of sufficient thickness to accommodate the optical paths, 156 and 157. The optical modulator width W131 is about 3 mm, and the optical modulator length L131 is about 10 mm. Lightwaves and modulation waves propagate essentially parallel to a plane, the (111) plane. The principal electric-field polarization of the modulation waves is approximately perpendicular to the plane, in the [111] direction. Within these constraints, the DC modulation of a lightwave is substantially independent of its propagation direction.

The index ellipsoid of the optical modulator 131 is modulated by electric field of a modulation wave. The lightwave modulation format of the present example may be described as a phase difference of the two polarization components along the principal axes in the index ellipsoid coordinate system. The phase difference is called the retardation, Γ. Optical elements in the optical transmitters, 161 and 162, prepare the lightwaves prior to modulation in the optical modulator 131. The optical receivers, 171 and 172, demodulate lightwaves modulated according to the present example embodiment using optical elements, converting them into amplitude modulated lightwaves. The amplitude modulated lightwaves may then be converted to electrical signals that may be recorded or analyzed.

Quarter waveplates in the optical transmitters, 161 and 162, are aligned to produce circularly polarized lightwaves entering the optical modulator 131. Polarizing beamsplitters in the optical receivers, 171 and 172, are aligned at π/4 radians to the principal axes in the index ellipsoid coordinate system. The optical modulator transmission function is given by, T=½[1±sin(Γ)], where the plus or minus depend upon the polarization selected from the polarizing beamsplitters. Both polarizations may be used in differential detection.

The OMDMS embodiment 100 may be designed so that the retardation, Γ, is sufficiently small that a linear modulation approximation applies, and T≈1/2[1±Γ]. A characteristic DC modulation voltage corresponding to a retardation off Γ=π radians, $V_\pi$, may be defined so that, Γ=πV/$V_\pi$. A DC voltage modulation linearity condition may then be expressed as, V<<$V_\pi$.

Retardation depends upon the relative propagation angle between the lightwave and the modulation wave, θ. A sinusoidal modulation wave electric field, $e_m$=($V_m$/d)cos($\omega_m t - k_m z + \phi$), uniform across the width W131 of the optical modulator 131, produces a lightwave retardation, $$\Gamma = \frac{\pi V_m}{V_\pi} \frac{\sin(\beta L_o/2)}{\beta L_o/2} \cos\left(\omega_m t - \omega_m \tau + \frac{\beta L_o}{2} + \phi\right), \quad (1)$$

where $\beta \equiv (n_o/n_m - \cos\theta) n_m \omega_m/c$. $V_m$ is a voltage magnitude associated with the modulation wave; $V_m/d$ is the modulation wave electric field magnitude; $\omega_m$ is the modulation wave radian frequency; t is time; $k_m$ is the modulation wave propagation constant in the optical modulator 131; z is the coordinate in the modulation wave propagation direction (determined in the present example embodiment from forward or backward modulation wave velocity vectors, 141 and 142); and is the modulation wave phase offset. $L_o$ is an optical path length corresponding to one of the optical path lengths, L156 and L157; and $\tau \equiv n_o L_o/c$ is the optical transit time through the optical modulator 131. $n_o$ is the refractive index of the optical modulator 131 for lightwave modulation; $n_m$ is the refractive index of the optical modulator 131 at the modulation wave frequency; θ is a relative propagation angle corresponding to one of the relative propagation angles between the lightwaves and the modulation waves, $\theta_1$, $\theta_2$, $\theta_3$, and $\theta_4$, 191, 192, 193, and 194; and c is the speed of light in vacuum.

In the phase-matched case, cos θ=$n_o/n_m$, and (1) reduces to, $$\Gamma = \frac{\pi V_m}{V_\pi} \cos(\omega_m t - \omega_m \tau + \phi). \quad (2)$$

The retardation follows the sinusoidal modulation wave electric field, $e_m$, with a delay of τ. In the OMDMS embodiment 100, the forward lightwave, represented by the forward lightwave modulation velocity vector 151, and the forward modulation wave, represented by the forward modulation wave velocity vector 141, are phase-matched, and the relative propagation angle between the forward lightwave and the forward modulation wave, $\theta_1$, 191 meets a phase-matched condition, $\cos\theta_1 = n_o/n_m$. The forward modulation wave signal modulates the forward lightwave with DC retardation amplitude and substantially no frequency dependence due to phase mismatch, to first order.

Similarly, the backward lightwave, represented by the backward lightwave modulation velocity vector 152, and the backward modulation wave, represented by the backward modulation wave velocity vector 142, are phase-matched, and the relative propagation angle between the backward lightwave and the backward modulation wave, $\theta_3$, 193 meets a phase-matched condition, $\cos\theta_3 = n_o/n_m$. The backward modulation wave signal modulates the backward lightwave with DC retardation amplitude and substantially no frequency dependence due to phase mismatch, to first order.

The angle between the forward lightwave modulation velocity vector 151 and the backward lightwave modulation velocity vector 152, is ($\pi$ radians$-2\theta_{PM}$), where $\theta_{PM} = \theta_1$ 191 = $\theta_3$ 193 is the phase-match angle. In the present example OMDMS embodiment 100, the forward and backward lightwaves emitted by the optical transmitters, 161 and 162, have wavelengths of about 1.3 µm. The phase-match angle, $\theta_{PM}$, is about 19 degrees, assuming that the modulation waves in the optical modulator 131 are essentially TEM.

In the OMDMS embodiment 100, the relative propagation angle, $\theta_2$, 192 between the backward lightwave modulation velocity vector 152 and the forward modulation wave velocity vector 141 is such that $\cos\theta_2 = -n_o/n_m$, representing significant phase mismatch between the forward modulation wave and the backward lightwave. Similarly, the relative propagation angle, $\theta_4$, 194 between the forward lightwave modulation velocity vector 151 and the backward modulation wave velocity vector 142 is such that $\cos\theta_4 = -n_o/n_m$, representing significant phase mismatch between the backward modulation wave and the forward lightwave.

When $\cos\theta = -n_o/n_m$, then $\beta L_o/2 = \omega_m\tau$, and (1) reduces to, $$\Gamma = \frac{\pi V_m}{V_\pi} \frac{\sin(\omega_m\tau)}{\omega_m\tau} \cos(\omega_m t + \phi). \quad (3)$$

The ratio of the phase-mismatched retardation amplitude to the phase-matched retardation amplitude in this example configuration is given by $\sin(\omega_m\tau)/(\omega_m\tau)$. In the present example OMDMS embodiment 100, the optical transit time $\tau$ is about 100 ps, and $\sin(\omega_m\tau)/(\omega_m\tau) < -20$ dB when the modulation wave frequency, $f_m = \omega_m/(2\pi) > 14$ GHz.

The foregoing analysis does not account for the effects of angular alignment tolerances and finite cross-sectional dimensions of the forward and backward lightwaves, both of which tend to limit high-frequency modulation response. A phase-match angular error, $\epsilon$, associated with one of the phase-matched relative propagation angles, $\theta_1$ and $\theta_3$, 191 and 193, will introduce a corresponding phase mismatch. Given that $\cos\theta = \cos(\theta_{PM}+\epsilon)$, $\beta L_o/2 \approx \omega_m\tau \cdot \epsilon \sqrt{n_m^2/n_o^2-1}/2$ in (1). In the present example OMDMS embodiment 100, an angular error, $\epsilon$, of 0.43 degrees from the phase-match angle causes the retardation amplitude to roll-off by 1 dB at modulation wave frequency, $f_m = 1$ THz.

A delay dispersion across a finite lightwave beamwidth in the optical modulator 131 limits high-frequency modulation response except in cases where the relative propagation angle is zero or pi radians. The relationship between the lightwave beamwidth, $w_o$, and the delay dispersion, $\Delta t$, may be derived from geometrical considerations, and is $w_o/\Delta t = c/\sqrt{n_m^2-n_o^2}$. In the present example OMDMS embodiment 100, $w_o/\Delta t = 250$ µm/ps. Lightwave beamwidth significantly less than 250 µm may be used for a specified roll-off at modulation wave frequency, $f_m = 1$ THz, depending upon the detailed lightwave beam profile and the performance specifications. The lightwave beamwidths may be controlled by discrete optical elements or by incorporating optical waveguides following the optical paths, 156 and 157, in the optical modulator 131. In the present example OMDMS embodiment 100, lenses in the optical transmitters, 161 and 162, condense the lightwave beamwidth in the optical modulator 131.

FIG. 2 presents a network model of the optical modulator 131 in the present example OMDMS embodiment 100, having modulation ports, P1 and P2, and optical ports, P3, P4, P5, and P6. Forward and backward modulation wave velocity vectors, 141 and 142, modulation wave inputs, $a_1$ and $a_2$, and modulation wave outputs, $b_1$ and $b_2$, are distinguished by narrow lines; lightwave modulation velocity vectors, 151 and 152, lightwave inputs, $a_5$ and $a_6$, and lightwave outputs, $b_3$ and $b_4$, are distinguished by wide lines; and electro-optic modulation couplings, 181, 182, 183, and 184, are distinguished by medium width lines.

The modulation wave sub-network is represented by a common 2-port network model associated with the modulation ports, P1 and P2. The forward and backward modulation waves, represented by the modulation wave velocity vectors, 141 and 142, are substantially unperturbed by the lightwaves, represented by the lightwave modulation velocity vectors, 151 and 152. The lightwaves, however, are modulated in the optical modulator 131 by the modulation waves through the electro-optic modulation couplings, 181, 182, 183, and 184.

The network model of FIG. 2 may be interpreted in terms of S-parameters. Square-law optical to electrical relationship is assumed, so optical power is comparable to square-root electrical power, the customary form for waves in S-parameter networks. The retardation analysis for phase-matched and phase-mismatched cases, above, may be used to assign nominal values to S-parameters, $S_{31}$, $S_{41}$, $S_{42}$, and $S_{32}$, for the electro-optic modulation couplings, 181, 182, 183, and 184. Directivities, D, may then be calculated as, $$D_3 = \left|\frac{S_{32}}{S_{31}S_{12}}\right| = \frac{\sin(\omega_m\tau)}{\omega_m\tau} \frac{1}{|S_{12}|}, \text{ and} \quad (4a)$$

$$D_4 = \left|\frac{S_{41}}{S_{42}S_{21}}\right| = \frac{\sin(\omega_m\tau)}{\omega_m\tau} \frac{1}{|S_{21}|}. \quad (4b)$$

Assuming $|S_{12}| = |S_{21}| > -10$ dB, $D_3 = D_4 < -10$ dB when the modulation wave frequency, $f_m = \omega_m/(2\pi) > 14$ GHz. Furthermore, the directivities, $D_3$ and $D_4$, generally decrease with increasing frequency according to the envelope of the sin($\omega_m\tau)/(\omega_m t)$ expression.

The present example OMDMS embodiment 100, provides for measuring the forward and backward modulation waves over an operational bandwidth from about 14 GHz to about 1 THz with directivity less than −10 dB and accounting for reasonably achievable angular and beamwidth tolerances. The operational bandwidth frequency ratio is greater than 70:1.

Since performance parameters depend on terms $\omega_m\tau$ and $w_o/\Delta t$, the present example OMDMS embodiment 100 may be scaled to lower or higher frequency ranges by increasing or decreasing the optical transit time, τ, and the lightwave beamwidth, $w_o$. The operational bandwidth may be shifted while keeping the directivity, D, and the phase-match angular error, ϵ, constant. The minimum operational frequency is limited only by practical size considerations as increases. A reasonable optical modulator length L131 of about 150 mm would enable a minimum operational frequency of about 1 GHz. The maximum operational frequency is limited by the electro-optic effect response, which falls off near the lattice resonance frequency. In GaAs, the lattice resonance frequency is about 8 THz.

The phase-matched term of the lightwave output $b_3$ is proportional to $a_5 a_1$, and the phase-matched term of the lightwave output $b_4$ is proportional to $a_6 a_2$. An OMDMS measurement may employ mixing of a modulation signal of the lightwave input $a_5$ with the modulation wave input $a_1$, or mixing of a modulation signal of the lightwave input $a_6$ with the modulation wave input $a_2$.

Useful techniques relying on mixing may be implemented in an OMDMS measurement, including homodyne, heterodyne, and sampling. A homodyne measurement may use a lightwave input modulation frequency that converts a modulation wave input signal to a baseband signal at the lightwave output. A heterodyne measurement may use a lightwave input modulation frequency that converts a modulation wave input signal to a signal around an intermediate frequency at the lightwave output. A real-time or equivalent-time sampling measurement may use a lightwave input pulse train that converts a modulation wave input signal to a sequence of pulses, or samples, at the lightwave output that are proportional to the modulation wave input signal.

The homodyne, heterodyne, and equivalent-time sampling techniques often convert to lower frequency ranges so that the optical receivers, 171 and 172, having lesser bandwidths may be employed. In addition, very high frequency signals or very short pulses, corresponding to bandwidths of 10 THz or more, are readily obtained with lightwave technologies, and an OMDMS may operate to similarly high frequencies, as previously described.

In an aspect, directional measurements may be made in an OMDMS embodiment by measuring a first lightwave modulation and a second lightwave modulation. The OMDMS embodiment 100, is adapted for simultaneous measurement of the first lightwave modulation and the second lightwave modulation. A first lightwave may be represented by the forward lightwave modulation velocity vector 151, and a second lightwave may be represented by the backward lightwave modulation velocity vector 152. A modulation wave may be represented by the forward modulation wave velocity vector 141.

The first lightwave modulation includes modulation of the first lightwave by the modulation wave while the first lightwave propagates at a first angle, $\theta_1$ 191, relative to the modulation wave. The second lightwave modulation includes modulation of the second lightwave by the modulation wave while the second lightwave propagates at a second angle, $\theta_2$ 192, relative to the modulation wave. The first and second lightwaves are modulated in the electro-optic modulator 131. The first optical receiver 171 may demodulate the first lightwave modulation, and the second receiver 172 may demodulate the second lightwave modulation.

Figure 3:
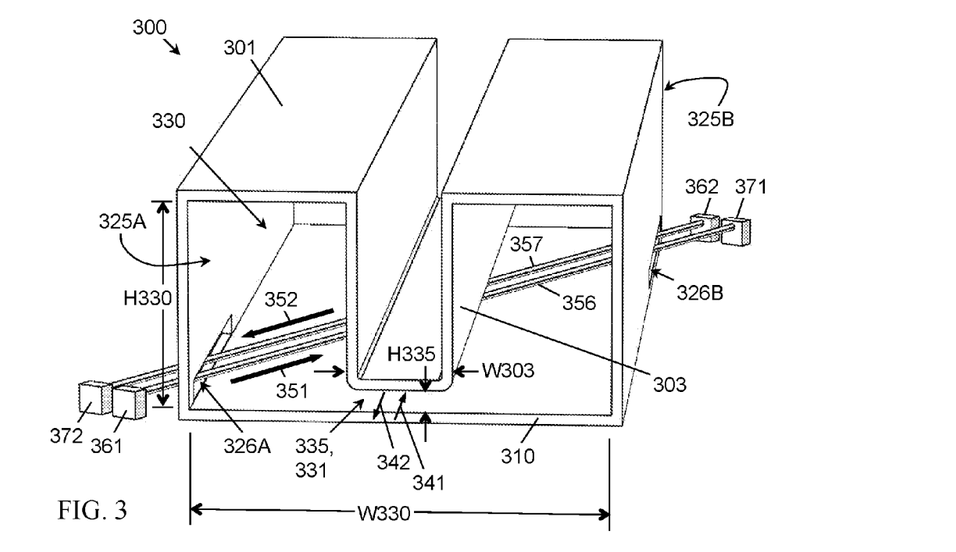
FIG. 3 is a perspective view of an optical modulator directional measurement system embodiment incorporating a modulation waveguide according to EXAMPLE 2.

EXAMPLE 2 (FIG. 3)

An optical modulator directional measurement system (OMDMS) embodiment 300, illustrated in perspective view in FIG. 3, enables directional measurements of forward and backward modulation waves. The OMDMS embodiment 300 incorporates a modulation waveguide 301 for guiding forward and backward modulation waves, represented by forward and backward modulation wave velocity vectors, 341 and 342.

The modulation waveguide 301 in the present example is a gap waveguide. A conductor wall 310 forms the boundary of the modulation waveguide 301, demarcating an interior region 330 of width W330 and height H330. A portion of the conductor wall 310 extends inward into the interior region 330, forming a ridge 303. An interior gap 335 of height H335 is formed in the interior region 330 between the ridge 303 and a proximate interior surface portion of the conductor wall 310. The ridge 303 has a ridge width W303 at the interior gap 335.

The interior region 330 includes an optical modulator 331. Modulation wave ports, 325A and 325B, provide for coupling of the forward and backward modulation waves to the modulation waveguide 301. Apertures, 326A and 326B, provide for coupling of forward and backward lightwaves, represented by velocity vectors, 351 and 352, to optical paths, 356 and 357, in the optical modulator 331. Optical transmitters, 361 and 362, transmit forward and backward lightwaves, represented by the forward and backward lightwave modulation velocity vectors, 351 and 352. Optical receivers, 371 and 372, receive and demodulate modulated forward and backward lightwaves.

The forward and backward modulation waves, represented by the forward and backward modulation wave velocity vectors, 341 and 342, propagate as forward and backward gap modes of the modulation waveguide 301. The interior gap 335 principally condenses the gap modes to a localized region including the interior gap 335. The gap modes are quasi-TEM far above cutoff, and the gap mode electric field polarizations are mostly vertical in FIG. 3, across the interior gap 335.

The gap modes of the modulation waveguide 301 are similar to dominant modes of microstrip or parallel-plate waveguides, which may be substituted in the present example OMDMS embodiment 300 with minimal change in configuration and give similar results. An OMDMS embodiment may be adapted to other waveguide types, such as stripline, coplanar strips, or coplanar waveguide. For example, an OMDMS embodiment using coplanar strips may be configured such that lightwaves pass between or reflect from the strips at angles so that they are phase-matched with modulation waves propagating on the coplanar strips.

GaAs crystal fills the interior region 330 of the present example embodiment, and the optical modulator 331 is an electro-optic modulator. The GaAs may be inserted into a preformed modulation waveguide 301, or the modulation waveguide 301 may be formed on preformed GaAs, for example, by depositing or plating conductor.

The GaAs crystal is oriented such that the [111] direction aligns with the modulation waveguide 301 gap mode principal electric field polarization. Lightwaves and modulation waves propagate essentially parallel to the (111) plane. The active portion of the optical modulator 331 is determined by the intersection of the GaAs crystal, the electric fields of the modes of the modulation waveguide 301, and the optical paths, 356 and 357. The active portion of the optical modulator 331 for the gap-mode forward and backward modulation waves is principally in and near the interior gap 335.

In an alternative embodiment, an electro-optic material wafer or plate may be placed such that it includes a localized region including the interior gap 335 and the optical paths, 356 and 357. In another alternative embodiment, the optical modulator 331 includes optical waveguides or fibers that follow the optical paths, 356 and 357 and pass through the interior gap 335. For example, optical waveguides may be fabricated by known integrated optoelectronics techniques of epitaxial layers and patterning on a wafer.

The interior region width and height, W330 and H330, of the present example embodiment are 12 mm and 6 mm, the ridge width W303 is about 3 mm, and the interior gap height H335 is about 0.64 mm. The modulation waveguide 301 gap mode cutoff is between 1 GHz and 2 GHz, and the effective characteristic impedance far above cutoff is about 14 ohms.

The optical paths, 356 and 357, are parallel and oriented at a phase-match angle relative to the modulation waveguide 301. The angle between the forward lightwave modulation velocity vector 351 and the backward lightwave modulation velocity vector 352 is $\pi$ radians. The component of the forward lightwave modulation velocity vector 351 in the direction of the forward modulation wave velocity vector 341 is substantially equal in magnitude to the forward modulation wave velocity vector 341, and the component of the backward lightwave modulation velocity vector 352 in the direction of the backward modulation wave velocity vector 342 is substantially equal in magnitude to the backward modulation wave velocity vector 342. In other words, the forward lightwave propagates substantially coherently or is phase-matched with the forward modulation wave, and the backward lightwave propagates substantially coherently or is phase-matched with the backward modulation wave.

The present example OMDMS embodiment 300 is modulation-wave-mode-selective. The odd symmetry modes of the modulation waveguide 301 have opposing electric fields that may nearly cancel in the accumulated modulation of a lightwave traversing the entire interior region width W330 along an optical path, 356 or 357. The odd symmetry modes may thus result in a nearly null modulation, depending on phase match. Some even symmetry modes, not including the gap modes, may have alternating field directions at the bottom of the modulation waveguide 301 that would tend to cancel in the accumulated modulation of a lightwave traversing the entire interior region width W330 along an optical path, 356 or 357.

All modes of the modulation waveguide 301 other than the gap modes propagate at velocities different from the gap mode velocity. The forward modulation wave of the present example, represented by the forward modulation wave velocity vector 341, propagates as a gap mode and is phase-matched with the forward lightwave modulation, represented by the forward lightwave modulation velocity vector 351. All other modes of the modulation waveguide 301 are phase-mismatched with the forward lightwave modulation. As a result, the gap mode forward modulation wave may produce a greater modulation transmission function of the forward lightwave modulation than would the other modes.

The retardation for each mode of the modulation waveguide 301 may be calculated using (1), where $n_m$ is the modal effective refractive index of the optical modulator 331 and the modulation waveguide 301 combination at the modulation wave frequency. At sufficiently high frequency, the optical modulator transmission function magnitude for the gap-mode modulation may be substantially greater than that for the other-mode modulations, and the gap mode may dominate the modulation of the forward lightwave.

The present example OMDMS embodiment 300 is functionally similar to that of the EXAMPLE 1 OMDMS embodiment 100, except for the additional function of the guiding of the modulation waves by the modulation waveguide 301 in the present example embodiment. Conditions, elements, and features not specified for the present example OMDMS embodiment 300 may be assumed to be functionally similar to those of the EXAMPLE 1 OMDMS embodiment 100. Thus, the analysis and results from EXAMPLE 1 may be applied to the present example. For example, an OMDMS embodiment 300 may perform approximately the same as an OMDMS embodiment 100, accounting for the modulation waveguide 301.

Figure 4:
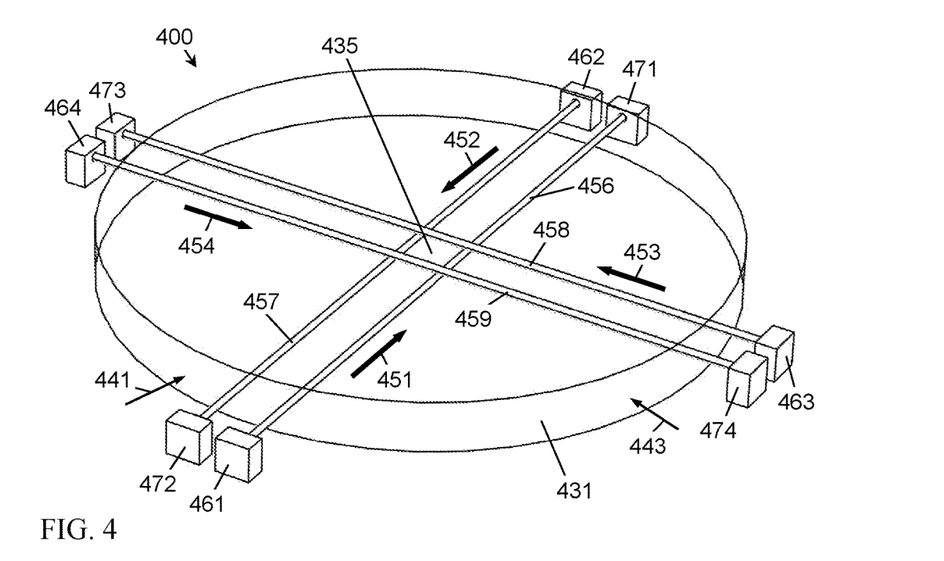
FIG. 4 is a perspective view of an optical modulator directional measurement system embodiment that supports measurements in multiple directions according to EXAMPLE 3.

EXAMPLE 3 (FIG. 4)

An optical modulator directional measurement system (OMDMS) embodiment 400, illustrated in perspective view in FIG. 4, supports directional measurements of modulation waves in multiple directions. The modulation waves, represented by modulation wave velocity vectors, 441 and 443, propagate in an optical modulator 431. Optical transmitters, 461, 462, 463, and 464, transmit lightwaves, represented by lightwave modulation velocity vectors, 451, 452, 453, and 454. The lightwaves follow optical paths, 456, 457, 458, and 459, in the optical modulator 431, then optical receivers, 471, 472, 473, and 474, receive the lightwaves and demodulate them.

The optical paths, 456, 457, 458, and 459, optical transmitters, 461, 462, 463, and 464, and optical receivers, 471, 472, 473, and 474, are configured such that the lightwave modulation velocity vectors, 451, 452, 453, and 454, are oriented at angular intervals of $\pi/2$ radians and parallel to a plane.

The optical modulator 431 of the present example embodiment is composed of a (111)-oriented GaAs wafer or plate. Lightwaves and modulation waves propagate essentially parallel to a plane, the (111) plane, and the modulation waves are electric-field polarized approximately perpendicular to the plane, in the [111] direction. Conditions, elements, and features not specified for the present example OMDMS embodiment 400 may be assumed to be functionally similar to those of the EXAMPLE 1 OMDMS embodiment 100.

Measurements from the optical receivers, 471, 472, 473, and 474, may be analyzed for modulation response and compared to modulations expressed by (1) to compute a modulation wave signal and direction of propagation. For example, in one aspect, modulation waves represented by the modulation wave velocity vectors, 441 and 443, separated in angle by $\pi/2$ radians may be measured and discriminated by aligning the modulation wave velocity vectors, 441 and 443, so that they are phase-matched with the lightwave modulation velocity vectors, 451 and 453. This may be a useful approach where the modulation wave velocity vectors have known discrete directions, for example, in a four-way junction.

The lightwave represented by the lightwave modulation velocity vector 451 would be modulated by the modulation wave represented by the modulation wave velocity vector 441 giving a phase-matched retardation described by (2). The lightwave represented by the lightwave modulation velocity vector 451 would also be modulated by the modulation wave represented by the modulation wave velocity vector 443. The angle between the lightwave modulation velocity vector 451 and the modulation wave velocity vector 443 is $\pi/2-\theta_{PM}$, which gives a retardation described by (1)

with $\beta L_o/2 = \omega_m \tau (1 - \sqrt{n_m^2/n_o^2 - 1})/2$. The phase-matched modulation may be discriminated from the phase-mismatched modulation in this aspect according to the ratio of the phase-mismatched retardation amplitude to the phase-matched retardation amplitude.

In another aspect, the OMDMS embodiment 400 may be rotated about a rotation point 435 or reoriented relative to the modulation waves to facilitate measurements that are continuous in angle and not restricted to a plane. Similar approaches could be used in aspects of the EXAMPLE 1 OMDMS embodiment 100 and EXAMPLE 2 OMDMS embodiment 300.

Figure 5:
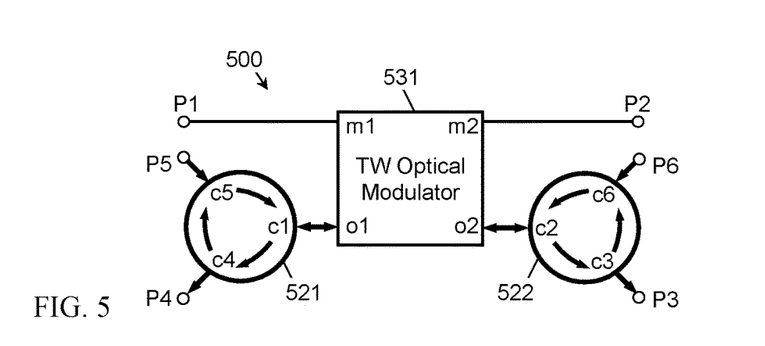
FIG. 5 is a block diagram of an optical modulator directional measurement system embodiment that enables measurements of forward and backward modulation waves according to EXAMPLE 4.

EXAMPLE 4 (FIG. 5)

An optical modulator directional measurement system (OMDMS) embodiment 500, illustrated in a block diagram in FIG. 5, enables directional measurements of forward and backward modulation waves in a travelling-wave optical modulator 531 having two modulator optical ports, o1 and o2. This form of OMDMS may be used with travelling-wave optical modulators having optical connectors or when the phase-match angle is substantially 0 degrees, for example.

The travelling-wave optical modulator 531 has modulator modulation ports, m1 and m2, one at each end of a modulation waveguide. An optical circulator 521 has three optical ports, c1, c4, and c5, and an optical circulator 522 has three optical ports, c2, c3, and c6.

OMDMS embodiment 500 modulation ports, P1 and P2, are electrically connected to modulator modulation ports, m1 and m2. The optical circulator port c1 is optically connected to the modulator optical port o1, and the optical circulator port c2 is optically connected to the modulator optical port o2. OMDMS embodiment 500 optical ports, P4 and P5, are optically connected to the optical circulator ports, c4 and c5. OMDMS embodiment 500 optical ports, P3 and P6, are optically connected to the optical circulator ports, c3 and c6.

The travelling-wave optical modulator 531 may be any travelling-wave optical modulator having at least one modulation path with access at each end and at least one lightwave path with access at each end. Modulators meeting these criteria include the optical modulators, 131, 331, and 431, of the example OMDMS embodiments, described above. Velocity-matched travelling-wave optical modulators and connectorized travelling-wave optical modulators may be suitable for use as the travelling-wave optical modulator 531.

The optical circulators, 521 and 522, serve as optical directional elements that separate forward and backward lightwaves at the modulator optical ports, of and o2, and deliver them to optical ports, P3, P4, P5, and P6. Optical circulators allow simultaneous measurements with small losses. Alternatively, other types of optical directional elements that separate forward and backward lightwaves may be used. For example, optical couplers, electro-optic switches, and other types of optical switches may provide sufficient function as optical directional elements.

The modulation ports, P1 and P2, and optical ports, P3, P4, P5, and P6 of the present example OMDMS embodiment 500 are functionally comparable to those of the optical modulator 131 in the network model of FIG. 2. A forward lightwave entering at optical port P5 is modulated by forward and backward modulation waves incident at modulation ports, P1 and P2, and exits from optical port P3. A backward lightwave entering at optical port P6 is modulated by forward and backward modulation waves incident at modulation ports, P1 and P2, and exits from optical port P4.

The forward lightwave entering at optical port P5 is phase-matched with the forward modulation wave incident at modulation port P1 and phase-mismatched with the backward modulation wave incident at modulation port P2, and the directivity may be described by (4a). The backward lightwave entering at optical port P6 is phase-matched with the backward modulation wave incident at modulation port P2 and phase-mismatched with the forward modulation wave incident at modulation port P1, and the directivity may be described by (4b).

The OMDMS embodiment 500 according to the present example is assembled from discrete, commercially available, connectorized components, which may enable the use of mass-manufactured components. Alternative embodiments may be assembled by custom fabrication or by a combination of commercially available and custom components. Mixing techniques described in EXAMPLE 1 may also be employed with the present example OMDMS embodiment 500.

In an aspect, the OMDMS embodiment 500 may include the travelling-wave optical modulator 531 and the two optical circulators, 521 and 522. The travelling-wave optical modulator 531 may have first and second optical ports, o1 and o2. The optical circulator 521 may have a first three optical ports, c1, c4, and c5, and the optical circulator 522 may have a second three optical ports, c2, c3, and c6. One of the first three optical ports, c1, is coupled to the first optical port o1, and one of the second three optical ports, c2, is coupled to the second optical port o2.

Figure 6:
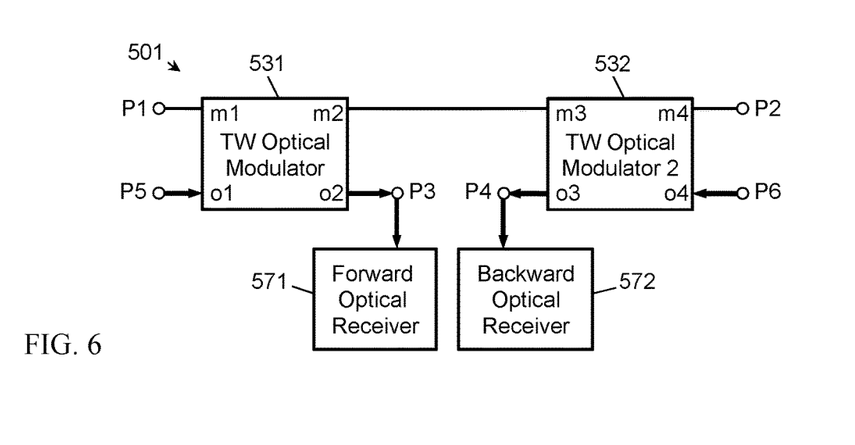
FIG. 6 is a block diagram of an optical modulator directional measurement system embodiment that enables measurements of forward and backward modulation waves according to EXAMPLE 5.

EXAMPLE 5 (FIG. 6)

An optical modulator directional measurement system (OMDMS) embodiment 501, illustrated in a block diagram in FIG. 6, enables directional measurements of forward and backward modulation waves using two travelling-wave optical modulators, 531 and 532, each having two modulator optical ports. This form of OMDMS may be used with travelling-wave optical modulators having optical connectors or when the phase-match angle is substantially 0 degrees, for example.

The travelling-wave optical modulator 531 has modulator modulation ports, m1 and m2, one at each end of a modulation waveguide, and two modulator optical ports, o1 and o2. The travelling-wave optical modulator 2 532 has modulator modulation ports, m3 and m4, one at each end of a modulation waveguide, and two modulator optical ports, o3 and o4. Modulator modulation ports, m2 and m3, are electrically connected, putting the modulation waveguides of modulator 531 and modulator 2 532 in series. OMDMS embodiment 501 modulation ports, P1 and P2, are electrically connected to modulator modulation ports, m1 and m4. Optical ports, P3, P4, P5, and P6, are optically connected to modulator optical ports, o2, 03, o1, and o4, respectively. An optical receiver 571 receiving forward lightwaves is optically connected to optical port P3 and an optical receiver 572 receiving backward lightwaves is optically connected to optical port P4.

Like the travelling-wave optical modulator 531, the travelling-wave optical modulator 2 532 may be any travelling-wave optical modulator having at least one modulation path with access at each end and at least one lightwave path with access at each end.

The modulation ports, P1 and P2, and optical ports, P3, P4, P5, and P6 of the present example OMDMS embodiment 501 are functionally comparable to those of the optical modulator 131 in the network model of FIG. 2 and the OMDMS embodiment 500. A forward lightwave entering at optical port P5 is modulated by forward and backward modulation waves incident at modulation ports, P1 and P2, and exits from optical port P3. A backward lightwave entering at optical port P6 is modulated by forward and backward modulation waves incident at modulation ports, P1 and P2, and exits from optical port P4.

The forward lightwave entering at optical port P5 is phase-matched with the forward modulation wave incident at modulation port P1 and phase-mismatched with the backward modulation wave incident at modulation port P2, and the directivity may be described by (4a). The backward lightwave entering at optical port P6 is phase-matched with the backward modulation wave incident at modulation port P2 and phase-mismatched with the forward modulation wave incident at modulation port P1, and the directivity may be described by (4b). Accordingly, the travelling-wave optical modulator 531, mostly responds to the forward modulation wave and the travelling-wave optical modulator 2 532 mostly responds to the backward modulation wave.

The OMDMS embodiment 501 according to the present example is assembled from discrete, commercially available, connectorized components, which may enable the use of mass-manufactured components. Alternative embodiments may be assembled by custom fabrication or by a combination of commercially available and custom components. Mixing techniques described in EXAMPLE 1 may also be employed with the present example OMDMS embodiment 501.

In an aspect, the OMDMS embodiment 501 is adapted for measurement of a forward or first lightwave modulation and a backward or second lightwave modulation. The first travelling-wave optical modulator 531 includes a modulation waveguide terminating at the ports, m1 and m2, and the second travelling-wave optical modulator 532 includes a modulation waveguide terminating at the ports, m3 and m4. The modulation waveguide of the first travelling-wave optical modulator 531 is connected in series with the modulation waveguide of the second travelling-wave optical modulator 532 by connecting ports, m2 and m3, for example.

The first lightwave modulation includes modulation of a first lightwave by the modulation wave in the first travelling-wave optical modulator 531 while the first lightwave and the modulation wave co-propagate. The second lightwave modulation includes modulation of a second lightwave by the modulation wave in the second travelling-wave optical modulator 532 while the second lightwave and the modulation wave counter-propagate.

Figure 7:
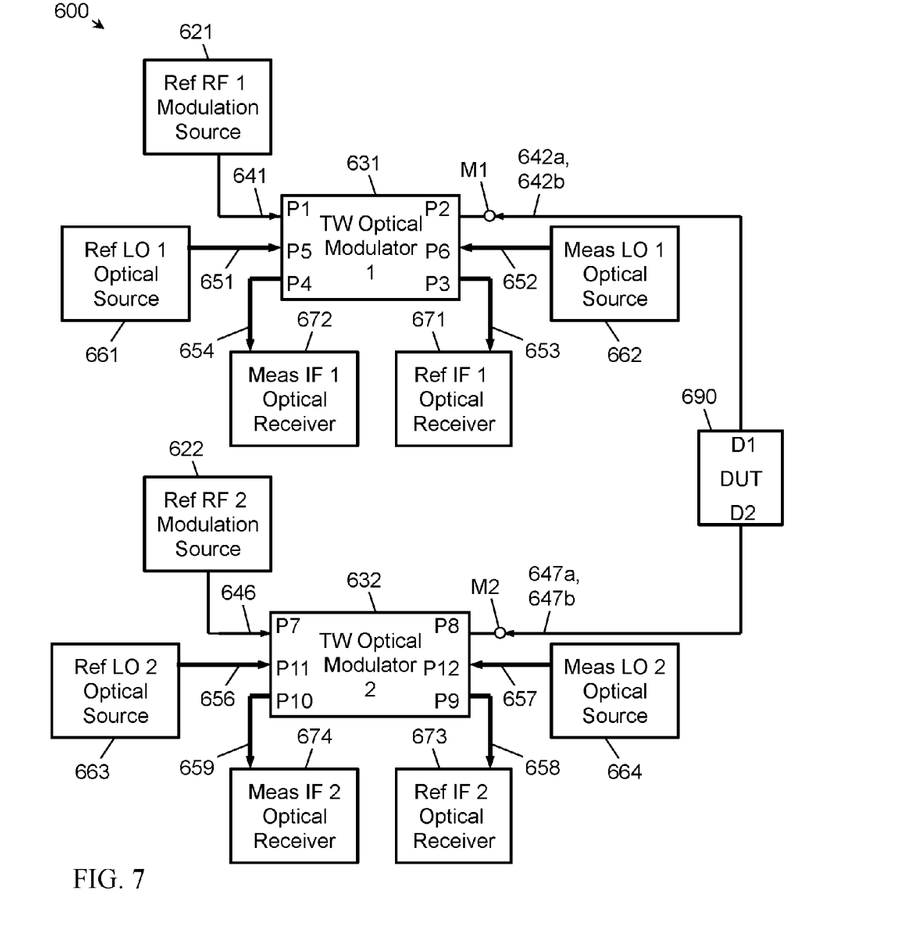
FIG. 7 is a block diagram of an optical modulator directional measurement system embodiment in a network analyzer according to EXAMPLE 6.

EXAMPLE 6 (FIG. 7)

FIG. 7 shows a block diagram of an optical modulator directional measurement system in a network analyzer (OMDMSNA) embodiment 600. A travelling-wave optical modulator 1 631 has modulation ports, P1 and P2, and optical ports, P3, P4, P5, and P6, and a travelling-wave optical modulator 2 632 has functionally comparable modulation ports, P7 and P8, and optical ports, P9, P10, P11, and P12, respectively. The modulation ports, P1 and P2, and optical ports, P3, P4, P5, and P6 of the travelling-wave optical modulator 1 631 are functionally comparable to those of the optical modulator 131 in the network model of FIG. 2 and the OMDMS embodiments 500 and 501.

A reference RF 1 modulation source 621 is electrically connected to the modulation port P1. A reference LO 1 optical source 661 is optically connected to the optical port P5. A reference IF 1 optical receiver 671 is optically connected to the optical port P3. A measurement LO 1 optical source 662 is optically connected to the optical port P6. A measurement IF 1 optical receiver 672 is optically connected to the optical port P4.

A reference RF 2 modulation source 622 is electrically connected to the modulation port P7. A reference LO 2 optical source 663 is optically connected to the optical port P11. A reference IF 2 optical receiver 673 is optically connected to the optical port P9. A measurement LO 2 optical source 664 is optically connected to the optical port P12. A measurement IF 2 optical receiver 674 is optically connected to the optical port P10.

A port D1 of a device under test (DUT) 690 is electrically connected to the modulation port P2 through an instrument measurement port M1, and a port D2 of the DUT 690 is electrically connected to the modulation port P8 through an instrument measurement port M2.

Instances of the OMDMS embodiment 500 serve as the travelling-wave optical modulator 1 631 and the travelling-wave optical modulator 2 632. The remaining components of the OMDMSNA embodiment 600 according to the present example are assembled from commercially available components. Microwave synthesizers are used as the modulation sources, 621 and 622. Lasers and optical modulators driven by microwave synthesizers are used as the optical sources, 661, 662, 663, and 664. Photoreceivers serve as the optical receivers, 671, 672, 673, and 674. Alternative embodiments may be assembled by custom fabrication or by a combination of commercially available and custom components.

The travelling-wave optical modulator 1 631 or the travelling-wave optical modulator 2 632 may form the core of a one-port network analyzer, enabling reflection measurements. The travelling-wave optical modulator 1 631 and the travelling-wave optical modulator 2 632 may cooperate to form the core of a two-port network analyzer, enabling reflection and transmission measurements. The measurements may be scalar or vector, vector including phase information. Network analyzer measurements are often converted to reflection and transmission coefficients or other network parameters. The OMDMSNA embodiment 600 may be used to measure two-port reflection and transmission vector network parameters for the DUT 690. The DUT 690 may be known or unknown. A known DUT 690 may be used for calibration or comparison.

The following is a description of an idealized network analyzer operation that does not account for transmission and reflection characteristics of the optical modulators, 631 and 632, and other components in the measurement path besides the DUT 690. Non-ideal characteristics may be mitigated by well-known calibration and correction techniques.

The terms RF, LO, and IF are used here according to a convention for describing operation of a vector network analyzer using frequency translation or conversion. As previously described, a mixing function may be executed in an optical modulator. As used herein, the terms RF, LO, and IF do not imply any limitations on frequency. They may apply to complex and modulated waveforms as well as single-frequency tones. The limitations on frequency are determined by the components used and their operation in the system.

In one aspect of operation, a measurement is made with stimulus 'on' at the measurement port M1 and 'off' at the measurement port M2. The stimulus, in this aspect a reference RF 1 modulation wave 641 from the reference RF 1 modulation source 621, enters the optical modulator 1 631 at the modulation port P1. A reference LO 1 lightwave 651 from the reference LO 1 optical source 661 enters at the optical port P5. The reference RF 1 modulation wave 641 propagates in a forward electrical direction through the optical modulator 1 631 mostly modulating the substantially phase-matched reference LO 1 lightwave 651 propagating in a forward optical direction, which then becomes a reference IF 1 lightwave 653. The reference IF 1 lightwave 653 exits at the optical port P3 and is received by the reference IF 1 optical receiver 671.

The reference RF 1 modulation wave 641 continues through the modulation port P2 and the measurement port M1 and is incident on the DUT 690 at the port D1, and is either transmitted through or reflected from the DUT 690.

The wave reflected from the DUT 690 is a reflected measurement RF 1 modulation wave 642a. The reflected measurement RF 1 modulation wave 642a again passes through the measurement port M1 and enters the optical modulator 1 631 at the modulation port P2. A measurement LO 1 lightwave 652 from the measurement LO 1 optical source 662 enters at the optical port P6. The reflected measurement RF 1 modulation wave 642a propagates in a backward electrical direction through the optical modulator 1 631 mostly modulating the substantially phase-matched measurement LO 1 lightwave 652 propagating in a backward optical direction, which then becomes a measurement IF 1 lightwave 654. The measurement IF 1 lightwave 654 exits at the optical port P4 and is received by the measurement IF 1 optical receiver 672.

The wave transmitted through the DUT 690 is a transmitted measurement RF 2 modulation wave 647a. The transmitted measurement RF 2 modulation wave 647a passes through the measurement port M2 and enters the optical modulator 2 632 at the modulation port P8. A measurement LO 2 lightwave 657 from the measurement LO 2 optical source 664 enters at the optical port P12. The transmitted measurement RF 2 modulation wave 647a propagates in a backward electrical direction through the optical modulator 2 632 mostly modulating the substantially phase-matched measurement LO 2 lightwave 657 propagating in a backward optical direction, which then becomes a measurement IF 2 lightwave 659. The measurement IF 2 lightwave 659 exits at the optical port P10 and is received by the measurement IF 2 optical receiver 674.

A scalar or vector reflection coefficient of the DUT 690 at port D1 may be calculated from the modulations of the measurement IF 1 lightwave 654 and the reference IF 1 lightwave 653. A scalar or vector transmission coefficient of the DUT 690 from port D1 to port D2 may be calculated from the modulations of the measurement IF 2 lightwave 659 and the reference IF 1 lightwave 653.

In another aspect of operation, a measurement is made with stimulus 'off' at the measurement port M1 and 'on' at the measurement port M2. The stimulus, in this aspect a reference RF 2 modulation wave 646 from the reference RF 2 modulation source 622, enters the optical modulator 2 632 at the modulation port P7. A reference LO 2 lightwave 656 from the reference LO 2 optical source 663 enters at the optical port P11. The reference RF 2 modulation wave 646 propagates in a forward electrical direction through the optical modulator 2 632 mostly modulating the substantially phase-matched reference LO 2 lightwave 656 propagating in a forward optical direction, which then becomes a reference IF 2 lightwave 658. The reference IF 2 lightwave 658 exits at the optical port P9 and is received by the reference IF 2 optical receiver 673.

The reference RF 2 modulation wave 646 continues through the modulation port P8 and the measurement port M2 and is incident on the DUT 690 at the port D2, and is either transmitted through or reflected from the DUT 690.

The wave reflected from the DUT 690 is a reflected measurement RF 2 modulation wave 647b. The reflected measurement RF 2 modulation wave 647b again passes through the measurement port M2 and enters the optical modulator 2 632 at the modulation port P8. The measurement LO 2 lightwave 657 from the measurement LO 2 optical source 664 enters at the optical port P12. The reflected measurement RF 2 modulation wave 647b propagates in the backward electrical direction through the optical modulator 2 632 mostly modulating the substantially phase-matched measurement LO 2 lightwave 657 propagating in the backward optical direction, which then becomes the measurement IF 2 lightwave 659. The measurement IF 2 lightwave 659 exits at the optical port P10 and is received by the measurement IF 2 optical receiver 674.

The wave transmitted through the DUT 690 is a transmitted measurement RF 1 modulation wave 642b. The transmitted measurement RF 1 modulation wave 642b passes through the measurement port M1 and enters the optical modulator 1 631 at the modulation port P2. The measurement LO 1 lightwave 652 from the measurement LO 1 optical source 662 enters at the optical port P6. The transmitted measurement RF 1 modulation wave 642b propagates in the backward electrical direction through the optical modulator 1 631 mostly modulating the substantially phase-matched measurement LO 1 lightwave 652 propagating in the backward optical direction, which then becomes the measurement IF 1 lightwave 654. The measurement IF 1 lightwave 654 exits at the optical port P4 and is received by the measurement IF 1 optical receiver 672.

A scalar or vector reflection coefficient of the DUT 690 at port D2 may be calculated from the modulations of the measurement IF 2 lightwave 659 and the reference IF 2 lightwave 658. A scalar or vector transmission coefficient of the DUT 690 from port D2 to port D1 may be calculated from the modulations of the measurement IF 1 lightwave 654 and the reference IF 2 lightwave 658.

The reference RF modulation waves, 641 and 646, and the modulations of the reference and measurement LO lightwaves, 651, 652, 656, and 657, may be frequency swept to produce measurements versus frequency. Channels may be added to measure a DUT having more ports by adding more travelling-wave optical modulators and associated instrument measurement ports, sources, and receivers.

Fine frequency and phase resolution may be facilitated at high frequencies by deriving all of the sources from a common origin. For example, all of the sources may derive from an optical origin, with the modulation sources, 621 and 622, comprising photodetectors that produce modulation waves by optical to electrical conversion. Reduced IF interference may be afforded by specifying different IF frequencies. For example, the reference LO 1 lightwave 651 and the measurement LO 1 lightwave 652 may be different so that the reference IF 1 lightwave 653 and measurement IF 1 lightwave 654 are different.

In an aspect, the OMDMSNA embodiment 600 for operation at a modulation frequency within a frequency range from 1 GHz to 8 THz may employ the travelling-wave optical modulator 1 631 adapted to simultaneously measure a forward lightwave modulation, corresponding to the modulation of the reference IF 1 lightwave 653, and a backward lightwave modulation, corresponding to the modulation of the measurement IF 1 lightwave 654.

The individual fabrication, process, and assembly steps and equipment needed to enable the above examples are well-known in the art. Persons of ordinary skill in the art would be able to produce satisfactory results from the descriptions given here without undue experimentation. It would be readily apparent to one of ordinary skill in the art that certain fabrication and assembly processes and methods may be better suited to certain structures.

INDUSTRIAL APPLICABILITY

The above disclosure and embodiments describe a novel and non-obvious type of directional measurement system, an optical modulator directional measurement system (OMDMS), that enables directional measurements and mixing over broad bandwidths at terahertz frequencies. Various other OMDMS embodiments may be conceived using the insight and guidance revealed herein without departing from the spirit and scope of the invention.

An OMDMS embodiment may serve as a core of a directional measurement instrument such as a network analyzer or spectrum or signal analyzer. It may be compatible with vector or scalar measurements. An OMDMS embodiment may also serve in a terminal of a full-duplex communication link operating at up to terahertz frequencies. An OMDMS embodiment may be used in measurement, communications, or processing systems, among others, exploiting physical phenomena in the terahertz range.

An OMDMS embodiment may quantify a linear or non-linear temporal or complex spectral response of a material or device in the terahertz frequency range, for example as in a terahertz vector network analyzer or vector signal analyzer. Physical phenomena, including molecular rotational transitions, vibrational modes of organic molecules, phonons in solids, semiconductor intraband transitions, and superconductor interband transitions, may have responses to electromagnetic stimulus in the terahertz frequency range. Such responses may be unique to a particular material or device, and they may be designed or manipulated as a property of a material or device.

Applications of OMDMS embodiments include circuits for identification or characterization of materials or devices in chemical, materials, medical, biotechnology, agriculture, food, electronics, computing, communications, radio astronomy, physics, reconnaissance, security, radar, and defense industries. An OMDMS embodiment may be used for monitoring and control in systems that alter or process materials by exciting specific modes or transitions to cause changes in molecular structure or some types of bonds.

OMDMS embodiments, in general, may be used for new applications and in extending the frequency range of applications currently deployed in the microwave, millimeter-wave, and far infrared regions of the spectrum. OMDMS embodiments may enable better performing materials, components, and processes.

The above disclosure is sufficient to enable one of ordinary skill in the art to practice the invention, and provides the best mode of practicing the invention presently contemplated by the inventor. Various modifications, alternative constructions, changes, and equivalents will readily occur to those skilled in the art and may be employed, as suitable, without departing from the spirit and scope of the invention. Such changes might involve alternative materials, components, structural configurations, sizes, shapes, forms, symmetries, asymmetries, functions, or operational features, for example. Accordingly, the scope of protection is not limited by the description set out above, but is limited only by the claims which follow, that scope including all equivalents of the claims. Any element in a claim that does not explicitly state "means for" performing a specified function, or "step for" performing a specific function, is not to be interpreted as a "means" or "step" clause as specified in 35 USC §112, ¶6.

I claim:

1. a directional measurement system comprising:
    a modulation waveguide, said modulation waveguide comprising a first conductor and a second conductor, and
    an electro-optic modulator, said electro-optic modulator disposed between said first conductor and said second conductor such that a straight line intersects, in sequence, said first conductor, said electro-optic modulator, and said second conductor,
    the system configured for:
        propagation of a modulation wave in said electro-optic modulator, said modulation wave guided by said modulation waveguide,
        propagation of a first lightwave in said electro-optic modulator, said first lightwave propagating at a first angle relative to said modulation wave in said electro-optic modulator, and
        propagation of a second lightwave in said electro-optic modulator, said second lightwave propagating at a second angle relative to said modulation wave in said electro-optic modulator, said second angle being substantially unequal to said first angle.

2. the directional measurement system of claim 1, wherein said modulation waveguide supports a substantially TEM mode.

3. the directional measurement system of claim 1, wherein said modulation waveguide is one of:
    a parallel-plate waveguide, and
    a microstrip waveguide.

4. the directional measurement system of claim 1, wherein said first angle is substantially the phase-match angle.

5. the directional measurement system of claim 1, wherein the sum of the cosine of said first angle and the cosine of said second angle is substantially zero.

6. the directional measurement system of claim 1, wherein:
    said electro-optic modulator comprises a cubic crystal, and
    said first lightwave, said second lightwave, and said modulation wave propagate substantially parallel to a (111) plane of said cubic crystal.

7. the directional measurement system of claim 1, further comprising:
    a first optical waveguide for guiding said first lightwave, and
    a second optical waveguide for guiding said second lightwave.

8. the directional measurement system of claim 1, further comprising:
    a first optical receiver, said first optical receiver configured for measurement of a first modulation of said first lightwave, and
    a second optical receiver, said second optical receiver configured for measurement of a second modulation of said second lightwave.

9. the directional measurement system of claim 1 in one of:

a network analyzer,
a spectrum analyzer,
a signal analyzer,
communication terminal, and
a sampling measurement system.

10. a directional measurement system comprising:
a modulation waveguide, and
an electro-optic modulator, said modulation waveguide and said electro-optic modulator integrally joined and fixed in relative disposition,
the system configured for:
propagation of a modulation wave in said electro-optic modulator, said modulation wave guided by said modulation waveguide,
propagation of a first lightwave in said electro-optic modulator, said first lightwave propagating at a first angle relative to said modulation wave in said electro-optic modulator, and
propagation of a second lightwave in said electro-optic modulator, said second lightwave propagating at a second angle relative to said modulation wave in said electro-optic modulator, said second angle being substantially unequal to said first angle.

11. the directional measurement system of claim 10, wherein said first angle is substantially the phase-match angle.

12. the directional measurement system of claim 10, wherein the sum of the cosine of said first angle and the cosine of said second angle is substantially zero.

13. the directional measurement system of claim 10, wherein:
said electro-optic modulator comprises a cubic crystal, and
said first lightwave, said second lightwave, and said modulation wave propagate substantially parallel to a (111) plane of said cubic crystal.

14. the directional measurement system of claim 10, further comprising:
a first optical waveguide for guiding said first lightwave, and
a second optical waveguide for guiding said second lightwave.

15. the directional measurement system of claim 10, wherein said modulation waveguide comprises a first modulation port at a first end and a second modulation port at a second end, further comprising:
a modulation source, said modulation source coupled to said first modulation port, and
a measurement port, said measurement port coupled to said second modulation port.

16. the directional measurement system of claim 10, further comprising:
a first optical receiver, said first optical receiver configured for measurement of a first modulation of said first lightwave, and
a second optical receiver, said second optical receiver configured for measurement of a second modulation of said second lightwave.

17. the directional measurement system of claim 10 in one of:
a network analyzer,
a spectrum analyzer,
a signal analyzer,
communication terminal, and
a sampling measurement system.

18. a method for making directional measurements in a modulation waveguide, said modulation waveguide comprising a first conductor and a second conductor, the method comprising:
disposing an electro-optic modulator between said first conductor and said second conductor such that a straight line intersects, in sequence, said first conductor, said electro-optic modulator, and said second conductor,
propagating a modulation wave in said electro-optic modulator, said modulation wave guided by said modulation waveguide,
propagating a first lightwave in said electro-optic modulator, said first lightwave propagating at a first angle relative to said modulation wave in said electro-optic modulator, and
propagating a second lightwave in said electro-optic modulator, said second lightwave propagating at a second angle relative to said modulation wave in said electro-optic modulator, said second angle being substantially unequal to said first angle.

19. the method of claim 18, wherein said first angle is substantially the phase-match angle.

20. the method of claim 18, wherein the sum of the cosines of said first angle and said second angle is substantially zero.

21. the method of claim 18, further comprising:
measuring a first modulation of said first lightwave, and
measuring a second modulation of said second lightwave.

* * * * *